(12) United States Patent
de Souza et al.

(10) Patent No.: US 9,768,254 B2
(45) Date of Patent: Sep. 19, 2017

(54) LEAKAGE-FREE IMPLANTATION-FREE ETSOI TRANSISTORS

(71) Applicant: INTERNATIONAL BUSINESS MACHINES CORPORATION, Armonk, NY (US)

(72) Inventors: Joel P. de Souza, Putnam Valley, NY (US); Keith E. Fogel, Hopewell Junction, NY (US); Jeehwan Kim, Los Angeles, CA (US); Devendra K. Sadana, Pleasantville, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/814,064

(22) Filed: Jul. 30, 2015

(65) Prior Publication Data

US 2017/0033177 A1 Feb. 2, 2017

(51) Int. Cl.
| | |
|---|---|
| *H01L 29/06* | (2006.01) |
| *H01L 29/08* | (2006.01) |
| *H01L 29/26* | (2006.01) |
| *H01L 29/66* | (2006.01) |
| *H01L 29/78* | (2006.01) |
| *H01L 29/786* | (2006.01) |
| *H01L 21/02* | (2006.01) |
| *H01L 29/267* | (2006.01) |

(52) U.S. Cl.
CPC .... *H01L 29/0847* (2013.01); *H01L 21/02488* (2013.01); *H01L 21/02554* (2013.01); *H01L 21/02565* (2013.01); *H01L 21/02576* (2013.01); *H01L 21/02587* (2013.01); *H01L 29/263* (2013.01); *H01L 29/267* (2013.01); *H01L 29/66969* (2013.01); *H01L 29/78603* (2013.01); *H01L 21/02521* (2013.01); *H01L 21/02551* (2013.01); *H01L 29/0638* (2013.01)

(58) Field of Classification Search
CPC ............. H01L 29/0638; H01L 29/0847; H01L 29/263; H01L 29/267; H01L 29/66969; H01L 29/78603
See application file for complete search history.

(56) References Cited

U.S. PATENT DOCUMENTS 5,164,805 A * 11/1992 Lee ...................... H01L 27/0605
257/351
5,841,170 A * 11/1998 Adan ................ H01L 29/78696
257/335

(Continued)

FOREIGN PATENT DOCUMENTS

| JP | 2007110007 A | 4/2007 |
|---|---|---|
| KR | 100814901 B1 | 3/2008 |

*Primary Examiner* — Ida M Soward
(74) *Attorney, Agent, or Firm* — Tutunjian & Bitetto, P.C.; Louis J. Percello

(57) ABSTRACT

A semiconductor device includes an extremely thin semiconductor-on-insulator substrate (ETSOI) having a base substrate, a thin semiconductor layer and a buried dielectric therebetween. A device channel is formed in the thin semiconductor layer. Source and drain regions are formed at opposing positions relative to the device channel. The source and drain regions include an n-type material deposited on the buried dielectric within a thickness of the thin semiconductor layer. A gate structure is formed over the device channel.

12 Claims, 2 Drawing Sheets

(56) References Cited

U.S. PATENT DOCUMENTS

| | | | |
|---|---|---|---|
| 7,145,169 B2 * | 12/2006 | Saso | H01L 29/1054 257/19 |
| 7,145,174 B2 | 12/2006 | Chiang et al. | |
| 8,148,728 B2 * | 4/2012 | Or-Bach | H01L 21/76254 257/347 |
| 8,507,989 B2 * | 8/2013 | Khakifirooz | H01L 21/84 257/347 |
| 8,686,412 B2 | 4/2014 | Herman et al. | |
| 8,742,503 B2 * | 6/2014 | Wang | H01L 21/84 257/347 |
| 8,766,410 B2 * | 7/2014 | Cai | H01L 21/84 257/348 |
| 8,962,399 B2 * | 2/2015 | Vinet | H01L 21/76248 438/151 |
| 2002/0182784 A1 * | 12/2002 | Hirashita | H01L 21/26513 438/149 |
| 2002/0185687 A1 * | 12/2002 | Koh | H01L 27/1203 257/347 |
| 2003/0203544 A1 * | 10/2003 | Chi | H01L 27/1203 438/149 |
| 2013/0001573 A1 | 1/2013 | Lee et al. | |
| 2013/0230949 A1 * | 9/2013 | Booth, Jr. | H01L 21/84 438/157 |
| 2013/0249004 A1 * | 9/2013 | Doris | H01L 27/1203 257/350 |
| 2014/0073119 A1 * | 3/2014 | Bedell | H01L 29/7847 438/480 |
| 2014/0145246 A1 * | 5/2014 | Ning | H01L 29/812 257/280 |
| 2015/0155353 A1 * | 6/2015 | Fan | H01L 21/84 257/347 |
| 2015/0270399 A1 * | 9/2015 | Zhu | H01L 21/84 257/347 |
| 2015/0295066 A1 * | 10/2015 | Grenouillet | H01L 29/42384 257/330 |
| 2016/0181382 A1 * | 6/2016 | Dutartre | H01L 29/41783 257/347 |
| 2016/0315056 A1 * | 10/2016 | Cheng | H01L 23/576 |

* cited by examiner

LEAKAGE-FREE IMPLANTATION-FREE ETSOI TRANSISTORS

BACKGROUND

Technical Field

The present invention relates to semiconductor processing, and more particularly to devices and methods that employ extremely thin semiconductor-on-insulator (ETSOI) substrates with active regions that are doped without needing to recrystallize the active regions.

Description of the Related Art

Metal oxide semiconductor field effect transistors (MOSFETs) often suffer from performance loss due to carrier leakage. One of the major leakage sources of MOSFET devices is drain-to-substrate leakage. Here, charge from the drain leaks into the substrate. This is made even more severe when epitaxially grown layer (epilayers) have defects. One method for addressing leakage into the substrate of the device is to provide a buried oxide layer. In a silicon-on-insulator (SOI) structure, a buried oxide layer is disposed between a base (bulk) substrate and a thin silicon layer. The devices are formed in the thin silicon layer, which is isolated from the base substrate by the buried oxide layer.

An extremely thin SOI (ETSOI) can reduce drain-to-substrate leakage and provide high field effect mobility. However, it is difficult to form source and drain regions using implantation methods since such methods damage the extremely thin layer during the implantation. In addition, the ETSOI is so thin that once the source and drain regions formed in the thin material are amorphized after implantation, the source and drain regions cannot be recrystallized since there is no seed layer below them to recrystallize them. Therefore, a recrystallization anneal has limited or no effect on reordering the crystalline structure of the source and drain regions.

SUMMARY

A semiconductor device includes an extremely thin semiconductor-on-insulator substrate (ETSOI) having a base substrate, a thin semiconductor layer and a buried dielectric therebetween. A device channel is formed in the thin semiconductor layer. Source and drain regions are formed at opposing positions relative to the device channel. The source and drain regions include an n-type material deposited on the buried dielectric within a thickness of the thin semiconductor layer. A gate structure is formed over the device channel.

Another semiconductor device includes an extremely thin semiconductor-on-insulator (ETSOI) substrate having a base substrate, a thin semiconductor layer and a buried dielectric therebetween. A device channel is patterned in the thin semiconductor layer. Openings are formed through the thin semiconductor layer to the buried dielectric. An aluminum doped zinc oxide material is deposited on the buried dielectric within the openings and forms source and drain regions within the openings at opposing positions relative to the device channel. A gate structure is formed over the device channel.

A method for forming a transistor includes patterning a thin semiconductor layer of an extremely thin semiconductor-on-insulator substrate (ETSOI), the ETSOI having a base substrate, the thin semiconductor layer and a buried dielectric therebetween, the patterning forming a device channel and defining openings for source and drain regions through the thin semiconductor layer; depositing an n-type material on the buried dielectric within the openings in the thin semiconductor layer to form source and drain regions at opposing positions relative to the device channel; and forming a gate structure over the device channel.

These and other features and advantages will become apparent from the following detailed description of illustrative embodiments thereof, which is to be read in connection with the accompanying drawings.

BRIEF DESCRIPTION OF THE SEVERAL VIEWS OF THE DRAWINGS

The disclosure will provide details in the following description of preferred embodiments with reference to the following figures wherein.

DETAILED DESCRIPTION

Figure 2:
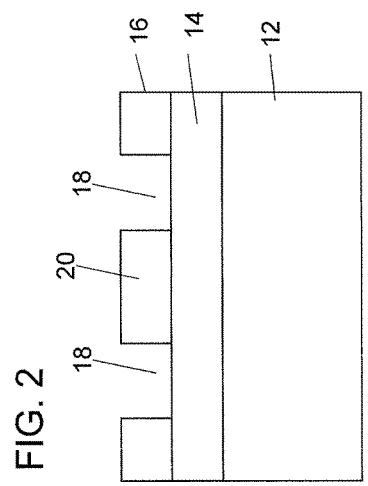
FIG. 2 is a cross-sectional view of the ETSOI substrate of FIG. 1 having source and drain regions defined by etching through a thin semiconductor layer of the ETSOI and a device channel defined in accordance with the present principles.

In accordance with the present principles, devices and methods are provided that include forming devices on an extremely thin semiconductor-on-insulator (ETSOI) substrate. In useful embodiments, a doped n-type material is deposited into recesses in the thin layer of the ETSOI to function as source/drain regions. The n-type material may include a II-VI material, such as zinc oxide (ZnO), indium tin oxide (ITO), indium zinc oxide (IZO), etc. The n-type material may be employed in an amorphous or polycrystalline state so that recrystallization is not a concern and is not needed.

In one embodiment, the ETSOI includes a thin semiconductor layer on a buried dielectric layer. The buried dielectric layer isolates the underlying base substrate to prevent leakage to the substrate. Then, the thin semiconductor layer is etched at locations where source and drain regions are to be formed. The thin semiconductor layer can be etched to form openings and expose the buried dielectric layer at the locations where the source and drain regions are to be formed. Next, the openings are filled with the n-type material. The n-type material is deposited and preferably doped during its formation (although the n-type material can be doped later as well). In a transistor device, the source and drain regions include a channel material between them, formed from the thin semiconductor layer. A gate structure and other structures can then be formed to complete the device.

It is to be understood that the present invention will be described in terms of a given illustrative architecture; however, other architectures, structures, substrate materials and process features and steps may be varied within the scope of the present invention.

It will also be understood that when an element such as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

The present embodiments may be includes in a design for an integrated circuit chip, which may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., ZnO. These compounds include different proportions of the elements within the compound, e.g., ZnO includes $Zn_xO_{1-x}$ where x is less than or equal to 1, etc. In addition, other elements may be included in the compound and still function in accordance with the present principles. The compounds with additional elements will be referred to herein as alloys.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This may be extended, as readily apparent by one of ordinary skill in this and related arts, for as many items listed.

Figure 1:
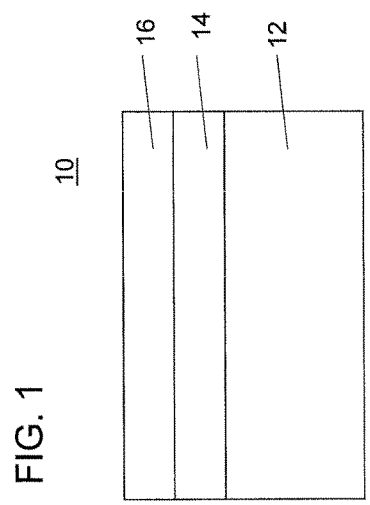
FIG. 1 is a cross-sectional view of an extremely thin semiconductor-on-insulator (ETSOI) substrate employed in accordance with the present principles.

Referring now to the drawings in which like numerals represent the same or similar elements and initially to FIG. 1, an ETSOI substrate 10 is shown for implementing the present principles. The substrate 10 includes a base substrate 12, a buried dielectric 14 and an extremely thin semiconductor layer 16, which will be referred to hereinafter as the thin layer 16 for ease of reference.

The base substrate 12 may include any suitable substrate material. In particularly useful embodiments, the base substrate 12 includes Si, SiGe, SiC, Ge, a III-V material (e.g., InP, InGaAs, GaAs, etc.) or any other suitable substrate material. The buried dielectric 14 may include an oxide, a nitride or any other suitable dielectric material. The buried dielectric 14 is employed to provide isolation for transistor devices (or any other device) formed in the thin layer 16.

The thin layer 16 includes a semiconductor material. The semiconductor material may include Si, Ge, SiGe, SiC, a III-V material (e.g., InP, InGaAs, GaAs, etc.) or any other substrate material. In useful embodiments, the thin layer 16 includes monocrystalline Si. The thin layer 16 will form a channel for transistor device embodiments. In particularly useful embodiments, the thin layer 16 may include a III-V material, which works particularly well with ZnO source and drain regions that will be formed.

Referring to FIG. 2, the thin layer 16 may be patterned to locate positions for source and drain regions to be formed. Patterning may include using a lithographic patterning technique, although other patterning techniques may be employed. In one embodiment, the thin layer 16 is etched down to the buried dielectric 14 in accordance with the pattern. The etching includes a directional etch and may include a reactive ion etch (RIE), although other etching processes may be employed to achieve the same results.

The etching completely removes the thin layer 16 material to expose the buried dielectric 14. The etching forms recesses or trenches 18 at locations where source and drain regions will be formed. The etching process also defines a device channel 20 between the locations where source and drain regions will be formed. The device channel 20 may be doped in any suitable manner to provide appropriate conduction properties to act as a device channel in the completed device.

Figure 3:
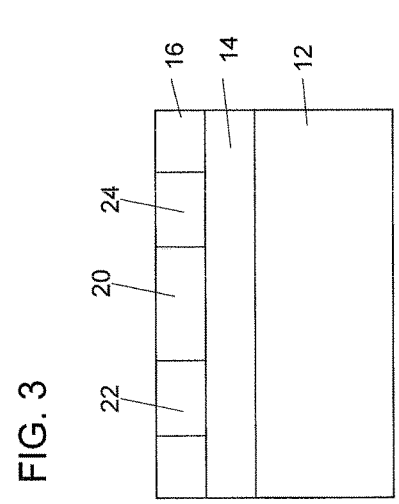
FIG. 3 is a cross-sectional view of the ETSOI substrate of FIG. 2 showing source and drain regions formed within a recessed region etched through the thin semiconductor layer of the ETSOI, the source and drain regions being planarized with the thin semiconductor layer in accordance with the present principles.

Referring to FIG. 3, an n-type material is formed in the recesses 18 (FIG. 2) to form source and drain regions 22, 24. It should be understood that the source and drain regions 22,

24 may have their positions switched. The n-type material may be deposited using a chemical vapor deposition (CVD), atomic layer deposition (ALD), an evaporation process or any other suitable deposition technique. The n-type material preferably includes a II-VI material, such as ZnO, ZnS, ZnSe, CdS, CdTe, etc. In useful embodiments, the n-type material includes ZnO, indium tin oxide (ITO), indium zinc oxide (IZO), etc. In one particularly useful embodiment, the n-type material includes Al doped ZnO (ZnO:Al or AZO).

A thickness of the n-type material may be maintained in the recesses 18 by performing a planarization process (e.g., a planarizing etch process, a chemical mechanical polish (CMP), etc.) to remove access n-type material from a surface of the thin layer 16. The doping of the n-type material is preferably provided during the formation or deposition of the n-type material (in-situ doping). However, since recrystallization is not needed, doping may be provided after the formation of the source and drain regions 22, 24, by implantation, diffusion or other doping processes. The source and drain regions 22, 24 are formed to a substantially same thickness as the thin semiconductor layer 16 (e.g., with +/−10% of the thickness).

The formation of source and drain regions 22, 24 from, e.g., ZnO:Al, may be provided using atomic layer deposition (ALD), although other processes may be employed. This permits a doped layer with less surface damage. In accordance with the present principles, a range of n-doping in ZnO of source and drain regions 22, 24 may be up to 2 atomic percent (e.g., ~$5\times10^{21}$/cm$^3$). ZnO dopants may include Al, B, Ga, In, etc., with ZnO:Al being preferred. The carrier concentration (electron density) of the source and drain regions 22, 24 may be between about $1\times10^{21}$ cm$^{-3}$ to about $5\times10^{21}$ cm$^{-3}$, and preferably about $3.0\times10^{21}$ cm$^{-3}$ for ZnO:Al (AZO).

The n-type material (e.g., ZnO:Al) for source and drain regions 22, 24 may be crystalline in form. This includes a monocrystalline structure and may include a multi-crystal structure or other crystalline structure (micro, nano, etc.). However, the AZO material may also include amorphous phases. In one embodiment, the ZnO of source and drain regions 22, 24 is amorphous.

Figure 4:
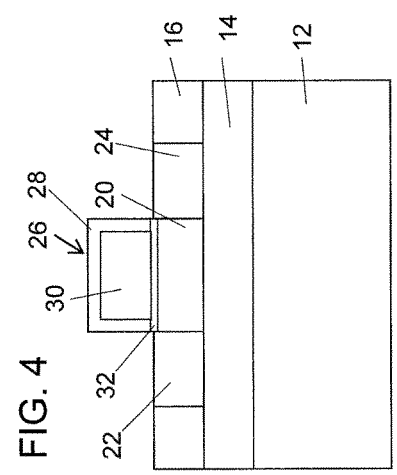
FIG. 4 is a cross-sectional view of the ETSOI substrate of FIG. 3 showing a gate structure formed over the device channel and including a gate dielectric, a gate conductor and a cap/space layer formed over the gate conductor in accordance with the present principles.

Referring to FIG. 4, a gate structure 26 is formed over the device channel 20. The gate structure 26 includes a gate dielectric 32. The gate dielectric 32 may include a grown or deposited dielectric layer and may include an oxide or nitride, although other dielectric materials may be employed. In one embodiment, a high-k dielectric material may be employed for the gate dielectric 32, e.g., HfO$_2$, Al$_2$O$_3$, Ta$_2$O$_5$, etc. A gate conductor 30 is deposited and patterned on the gate dielectric 32 and over the device channel 20. The gate conductor 30 may include W, Ag, Au, Cu or other metals. The gate conductor 30 is isolated by a dielectric material 28 that may be formed as sidewall spacers and/or a cap layer. The dielectric material 28 may include a nitride, oxide or other dielectric materials.

Processing continues by providing electrical connections to the source region 22, drain region 24 and the gate conductor 30. The electrical connections are preferably in the form of contacts formed from metal, e.g., Ti, Pd, Au, etc. and metal lines, etc.

In accordance with the present principles, a field effect transistor 40 is provided that employs deposited n-type II-VI material instead of implanted dopants to form source and drain regions 22, 24. The device is leakage-free due to the use of the buried dielectric 14. In one embodiment, the source and drain regions 22, 24 are not damaged by dopant implantation processes. In accordance with the present principles, the advantages of the high mobility device channel 20 of the ETSOI are provided without the need to recrystallize the thin layer 16 (without a seed layer).

Figure 5:
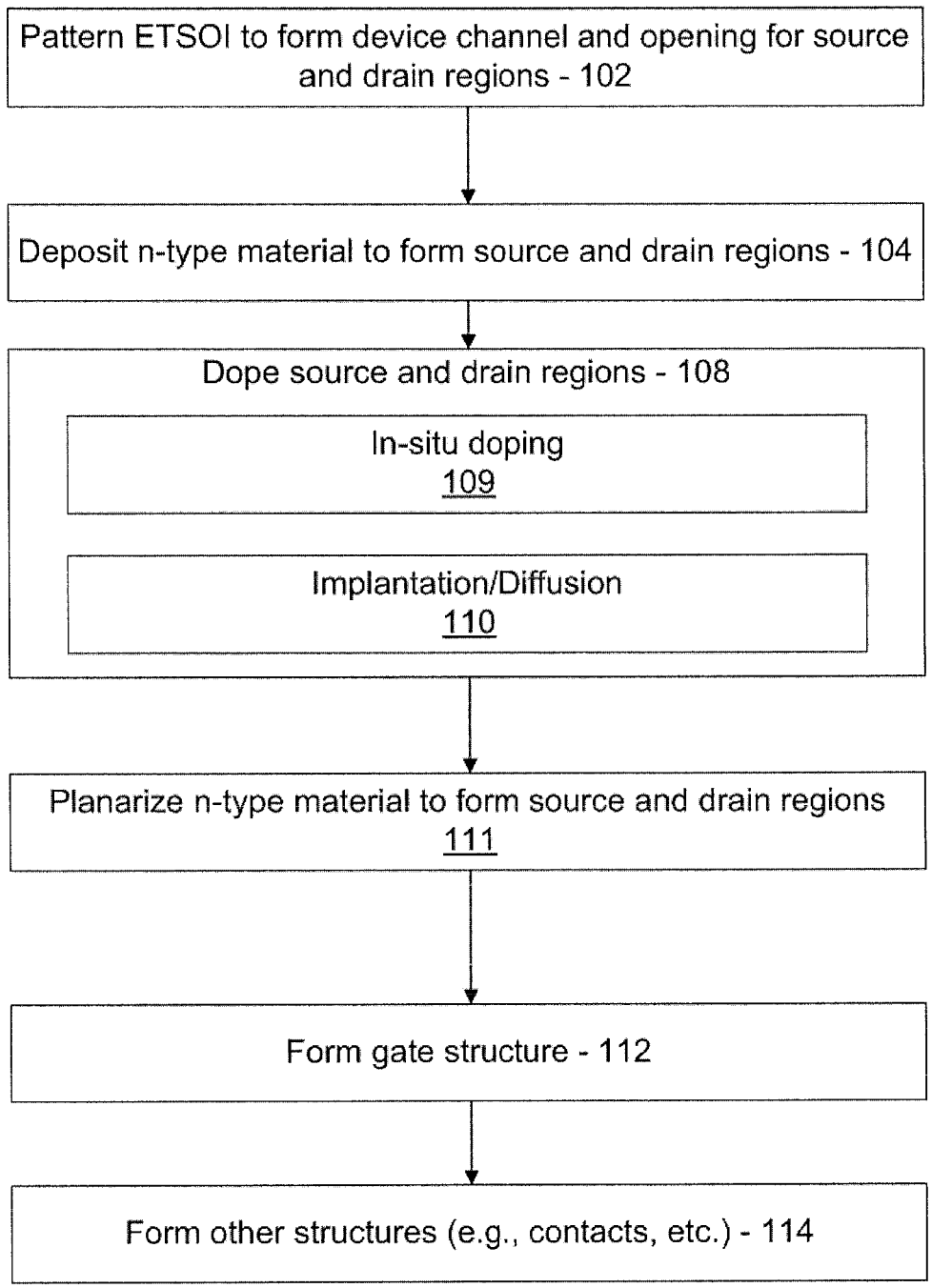
FIG. 5 is a block/flow diagram showing a method for forming a transistor of an ETSOI substrate in accordance with illustrative embodiments.

Referring to FIG. 5, a method for forming a transistor on an ETSOI substrate is illustratively shown in accordance with the present principles. In some alternative implementations, the functions noted in the blocks may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

In block 102, a thin semiconductor layer of an extremely thin semiconductor-on-insulator substrate (ETSOI) is patterned. The ETSOI includes a base substrate, the thin semiconductor layer and a buried dielectric therebetween. The patterning forms a device channel and defines openings for source and drain regions through the thin semiconductor layer. The openings are etched through the thin semiconductor layer to expose the buried dielectric. The patterning may be performed using lithographic processing techniques.

In block 104, an n-type material is deposited on the buried dielectric within the openings in the thin semiconductor layer to form source and drain regions at opposing positions relative to the device channel. The n-type material may include II-VI material, e.g., ZnO. In one embodiment, the ZnO is Al-doped. The n-type material may include an amorphous phase and does not need to be crystallized to form source and drain regions. Doping may occur during the formation of the n-type material.

In block 108, the n-type material is doped. In block 109, the source and drain region may be doped in-situ (e.g., doping is performed during formation of the n-type material). In one embodiment, doping is performed during formation, e.g., by atomic layer deposition. In block 110, while in-situ doping is preferred, the source and drain regions may be doped by performing an implantation or other process (dopant diffusion). In accordance with the present principles, monocrystalline materials are no longer needed for the source and drain regions. Instead, the source and drain region are deposited and may be doped by implantation since the structure may be non-crystalline (amorphous). In one embodiment, the doping of the source and drain regions is performed after the source and drain regions are formed. However, the implanting process may be performed at other times (e.g., after a gate structure is formed.

In block 111, in one embodiment, the n-type material is planarized to form the source and drain regions at a substantially same thickness as the thin semiconductor layer. The planarization process may include an etch, a polish or a CMP process.

In block 112, a gate structure is formed over the device channel. The source and drain regions may be doped by implantation (or other process) after forming the gate structure. In block 114, contacts to the source and drain regions and the gate conductor may be formed as well as other structures to complete the device.

Having described preferred embodiments for leakage-free implantation-free ETSOI transistors (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

The invention claimed is:

1. A semiconductor device, comprising:
an extremely thin semiconductor-on-insulator substrate (ETSOI) having a base substrate, a thin semiconductor layer and a buried dielectric therebetween;
a device channel formed in the thin semiconductor layer;
source and drain regions formed at opposing positions relative to the device channel, the source and drain regions including an n-type material deposited on the buried dielectric within a thickness of the thin semiconductor layer, wherein the n-type material includes ZnO; and
a gate structure formed over the device channel.

2. The semiconductor device as recited in claim 1, wherein the ZnO is Al-doped.

3. The semiconductor device as recited in claim 1, wherein the source and drain regions are formed to a substantially same thickness as the thin semiconductor layer.

4. The semiconductor device as recited in claim 1, wherein the device channel includes material comprising the thin semiconductor layer.

5. A semiconductor device, comprising:
an extremely thin semiconductor-on-insulator (ETSOI) substrate having a base substrate, a thin semiconductor layer and a buried dielectric therebetween;
a device channel patterned in the thin semiconductor layer;
openings formed through the thin semiconductor layer to the buried dielectric;
an aluminum doped zinc oxide material deposited on the buried dielectric within the openings and forming source and drain regions within the openings at opposing positions relative to the device channel; and
a gate structure formed over the device channel.

6. The semiconductor device as recited in claim 5, wherein the source and drain regions are formed to a substantially same thickness as the thin semiconductor layer.

7. The semiconductor device as recited in claim 5, wherein the n-type material includes an amorphous phase.

8. A semiconductor device, comprising:
an extremely thin semiconductor-on-insulator substrate (ETSOI) having a base substrate, a thin semiconductor layer and a buried dielectric therebetween;
a device channel formed in the thin semiconductor layer;
source and drain regions formed at opposing positions relative to the device channel, the source and drain regions including an n-type material deposited on the buried dielectric within a thickness of the thin semiconductor layer wherein the n-type material includes an amorphous phase; and
a gate structure formed over the device channel.

9. The semiconductor device as recited in claim 8, wherein the n-type material includes ZnO.

10. The semiconductor device as recited in claim 9, wherein the ZnO is Al-doped.

11. The semiconductor device as recited in claim 8, wherein the source and drain regions are formed to a substantially same thickness as the thin semiconductor layer.

12. The semiconductor device as recited in claim 8, wherein the device channel includes material comprising the thin semiconductor layer.

* * * * *